(12) United States Patent
Selker et al.

(10) Patent No.: US 10,048,769 B2
(45) Date of Patent: Aug. 14, 2018

(54) THREE-DIMENSIONAL COMPUTER-AIDED-DESIGN SYSTEM USER INTERFACE

(71) Applicant: Ted Selker, Palo Alto, CA (US)

(72) Inventors: Ted Selker, Palo Alto, CA (US); Kim Rubin, Menlo Park, CA (US)

( * ) Notice: Subject to any disclaimer, the term of this patent is extended or adjusted under 35 U.S.C. 154(b) by 136 days.

(21) Appl. No.: 15/353,171

(22) Filed: Nov. 16, 2016

(65) Prior Publication Data

US 2017/0139483 A1    May 18, 2017

Related U.S. Application Data

(60) Provisional application No. 62/256,984, filed on Nov. 18, 2015.

(51) Int. Cl.
| | |
|---|---|
| *G06F 3/048* | (2013.01) |
| *G06F 3/01* | (2006.01) |
| *G06F 3/0481* | (2013.01) |
| *G06F 3/0484* | (2013.01) |
| *G06F 17/50* | (2006.01) |

(52) U.S. Cl.
CPC .......... *G06F 3/017* (2013.01); *G06F 3/04815* (2013.01); *G06F 3/04842* (2013.01); *G06F 17/50* (2013.01)

(58) Field of Classification Search
CPC ....................................................... G06F 3/017
USPC ....................................................... 715/852
See application file for complete search history.

(56) References Cited

U.S. PATENT DOCUMENTS

| | | | | |
|---|---|---|---|---|
| 8,854,433 | B1 * | 10/2014 | Rafii .................... | G06F 3/017 348/42 |
| 9,383,895 | B1 * | 7/2016 | Vinayak ................ | G06F 3/017 |
| 9,696,808 | B2 * | 7/2017 | Nishihara ............. | G06F 3/017 |
| 9,720,507 | B2 * | 8/2017 | Burr .................... | G06F 3/017 |
| 9,870,061 | B2 * | 1/2018 | Sugiyama ............. | G06F 3/017 |
| 2006/0182346 | A1 * | 8/2006 | Yoda .................... | G06F 3/017 382/190 |
| 2008/0231926 | A1 * | 9/2008 | Klug .................... | G06F 3/017 359/23 |
| 2009/0103780 | A1 * | 4/2009 | Nishihara ............. | G06F 3/017 382/103 |

(Continued)

*Primary Examiner* — William Titcomb
(74) *Attorney, Agent, or Firm* — Kim Rubin

(57) ABSTRACT

A three-dimensional (3D) computer aided design (CAD) user interface (UI) is described that maps both two-handed and one-handed free hand gestures and poses to map to actions in the 3D CAD UI environment. Free hands may be used to directly both constrain and organically modify an object. Intuitive analogs to physical tools are used, with gradual changes to visibility. Parts are automatically modified to meet object-specific and rule-based constraints. Multiple copies of a physical analog element, with known dimensions, may be continually created by a free hand and automatically assembled into an appropriate, organized and contiguous structure containing integral visible fiducials based on the dimensions of the element. Temporary layers of an object are used to permit organic modifications of portions of an object. Use of a fastener creates and then fastens to a mating part. Visible physical analogs provide perspective. Non-linear magnification permits rapid, wide dynamic range object modification.

20 Claims, 4 Drawing Sheets

(56) References Cited

U.S. PATENT DOCUMENTS

| | | | |
|---|---|---|---|
| 2012/0280927 A1* | 11/2012 | Ludwig | G06F 3/041 345/173 |
| 2014/0168084 A1* | 6/2014 | Burr | G06F 3/0304 345/168 |
| 2015/0227214 A1* | 8/2015 | Sugiyama | G06F 3/017 345/157 |
| 2016/0180701 A1* | 6/2016 | Golliher | G06F 3/017 340/12.5 |
| 2017/0060254 A1* | 3/2017 | Molchanov | G06F 3/011 |

* cited by examiner

NAVIGATOR (XYZ)

OBJECT VIEW

US 10,048,769 B2

THREE-DIMENSIONAL COMPUTER-AIDED-DESIGN SYSTEM USER INTERFACE

FIELD OF THIS INVENTION

The problem to be solved is, "how to make a three-dimensional (3D) computer aided design (CAD) system more effective." The field is 3D CAD systems. The field is more particularly the user interface (UI) of a 3D CAD system.

A 3D CAD system includes design or viewing capabilities, or both. Prior art in 3D CAD UI includes keyboards, touch pads, touchscreens, mice, trackballs, and tablets. Actions of the 3D CAD system responsive to these sensors include changing the dimensions of an object; changing a viewpoint of the object; moving one portion of an object with respect to another portion of an object; selecting a component from a library; drawing a portion of an object; altering the material or texture of an object; performing administrative functions such as loading, saving, transmitting or printing object data; and the like. By "object," we mean any part, portion, attribute or entirety of an object or set of associated objects. "Object" may be the traditionally named, "workpiece;" however its use herein has wider scope, including one or more objects, elements, and tools.

An object is a visual, and optionally haptic or audio, representation of physical object, such as a physical coffee cup; or an object that remains virtual, such as a character in a movie, game, virtual reality environment or an operator environment, such as the driver of an automobile or any other conveyance or sports equipment. Such a virtual object may be, for example, a deer in a heads-up display for a driver.

A weakness of prior art is the use of mono-functional buttons and fill-in-the-blank fields. These UI elements do not take advantage of either intuitive analogs of physical object and do not take advantage of the 46 muscles in the hand. Thus, they suffer both a very high learning curve and slow usage. An action that might be done by a hand on a real object in a few seconds takes many minutes in a prior art 3D CAD UI.

SUMMARY OF THE INVENTION

A key strength of embodiments is the natural use of hands directly on an object; that is, natural use of real hands on a virtual object. Compare the number of muscles, nerves and joints in a human hand and arms to the degrees of freedom of a mouse or stylus.

Embodiments of this invention include a user interface (UI) in a three-dimensional (3D) computer aided design (CAD) system that is responsive to gestures and poses of both hands of the human user. A gesture is a motion of a hand. A pose is a non-moving position of a hand. By hand, we mean any portion, or the entirety of a hand or arm.

A cooperative gesture or pose requires both hands working in coordination and thus having a known or important relationship respective to each other. For example, a pose of holding a beach ball, a gesture of catching a football, or a pose where the fingers are interlaced. A cooperative gesture or pose has a single meaning, at least with respect to a sequence or operating mode of the 3D CAD system, as compared to two independent meanings from each hand separately.

An independent or disparate gesture or pose is where the two hands do not need a fixed relationship to each other. A more complex combined disparate gesture example is tossing a tennis ball in the air with one hand and then serving it with a tennis racket using the other hand. Another complex combined disparate example is picking up and then holding still a teacup, by its handle, with one hand, and then picking up and dropping into the cup in two sugar lumps using the second hand. If each hand is performing a respective disparate gesture or pose, a first hand performing a different disparate pose does not change the meaning of the disparate pose of the second hand. Examples of disparate gesture or poses include digits and the alphabet letters of American Sign Language (ASL). Some two-handed gestures may be either cooperative or disparate, depending on context and the linkage between the actions that the two hands cause. An example is when one hand indicates a constraint while the other hand indicates an action. Often, the constraint hand is the non-dominant hand and the action hand is the dominant hand, as this is the natural intuitive usage for most people.

Embodiments use eating and cooking tool analogs, as well as shop tools and sewing tools. An analog of constraining an object may be to hold it with a fork or vice. An analog of cutting an object or creating an edge or face may be using a knife or saw. An analog of a spoon may be used to add incremental amounts of a characteristic, such a radius, recess, size, color, or one or more of numerous characteristics of a part, tool, or environment. A spoon may be used to provide either a continuously variable change, or a quantized change; that is, a "spoonful" at a time. A rolling pin is a good analog for creating a flat or smooth surface. An icepick is a useful analog for identifying and exact point or location. A strainer is a useful analog for permitting some attributes to remain while removing others.

Embodiments use a pair of glasses to provide a quick, temporary view of otherwise not visible parameters or attributes. Different glasses—"filters"—may be predefined by users; then, these various pairs of virtual glasses may sit on a virtual tabletop for a user to quickly select, use, and replace on the table.

With respect to a 3D CAD system UI, gestures and poses such as exemplified above are intuitive analogous actions on an object. By using a person's extensive natural, complex anatomy, and their extensive skill set using their hands, both learning the UI and using the UI are made more efficient, including increased productivity, less user frustration and the many other benefits of an improved UI.

A nexus of embodiments is the use of free-hand gestures and poses, as compared to the use of prior art sensors that highly constrain hand movements, such as keyboards and mice, or require an essentially fixed hand position, such as holding a stylus.

Embodiments claim specific mappings of the gesture and pose analogs to actions within the 3D CAD UI environment.

One such mapping is the use of one hand to implement a motion constraint on the object while the second hand performs a function on the object. The first hand may be viewed as a vice; however, the motion constraints may be much more flexible than the "all or none" constraint of a physical vice. For example, only one axis of motion may be constrained, or only a portion of the object may be constrained so that another portion may be altered. For example, the base of a cup may be completely constrained by one hand while the height of the cup is lengthened by other hand. The first hand performs a squeezing motion gesture, then a fixed holding pose, while the other hand uses a pinching gesture to grasp the top of the cup and then a lifting gesture to increase the height of the cup. Cup diameter or bowl angle may be previously defined as fixed so that the lifting of the top of the cup performs the desired operation on the cup.

Another embodiment is the use of an integral or natural fiducial. By this we mean selecting an analog object of known dimensions or shape, such as a brick or a sheet of plywood, that may be suitably scaled or proportioned. This analogous fiducial object is then applied, in quantity, to the object. "Applying" may be dripping, painting, throwing, touching or other methods. Since the analogous fiducial object has known dimensions or shape, as these objects accumulate on the object, such as brick in a wall, the dimensions and shape of the object are inherently visible to the user without the need for artificial rulers, workspace grid-marks and the like. We refer to aspects of these embodiments as natural fiducials, integral fiducials, or analogous fiducials. One might think of dripping bricks from the fingertips of one hand to create a wall, while the other hand moves the object around so the walls build in various locations on the object as the user desires. Despite significant perspective changes as the object or viewing angle are moved, the use of bricks as the analogous fiducials allows the user to see the actual dimensions and shape of the elements of, and the entire object, as she builds it. As another example, a tall, thin object may be created by rapidly stacking plates. A shell may be quickly assembled using sheets of plywood.

Yet another embodiment is "self alignment" of the above analogous fiducial elements. For example, although bricks are "dripped," quite loosely, from the fingertips of one hand, they self-align on the object to build a plumb and level wall. As another example, sheets of plywood self-assembly by lining up edges to build a shell structure whose relative angles between sheets are fixed at zero degrees or ninety degrees. Such plywood sheets snap to the nearest aligned position, as they are dropped or tossed against the object.

Such construction techniques are likely to be inherently crude, compared to typing in exact dimension to a preselected shape. However, embodiments permit fast modification of these original shapes by the free use of the hands, as might shape a sand castle, block of clay, or folded cardboard. Of course, at any point, prior art tools for high precision final adjustments are available. In addition, highly flexible constraints may be used to hold a large portion of a work stable while a small section is worked. Rapidly adjustable, and non-linear magnification permits a wide dynamic range of effects that can be created simply with free hands or simple tools. Enlarged hands may shape a house, and then tiny hands add fine detail to a light fixture. Simple tools include analogs of the tools used in the arts of shaping clay, woodworking, and cooking.

A "fiducial" refers to a visible indication of a unit of measurement. Such a unit may be for distance, area volume, planar or solid angle, weight or density, plasticity, time, or another parameter. A fiducial may refer to an object, positive space or negative space, a tool, or an attribute of the environment. A key distinction between fiducials and prior art grids or rulers is that grids and rulers are generally global (although only a portion may be shown) whereas fiducials are local, such as for a portion (or all) of an object or tool. Integral fiducials, such as described elsewhere herein, are a particularly elegant and novel embodiment.

Yet another embodiment is a variation of the above embodiment where the "self-alignment" is not just a physical alignment, but also an alignment with a set of constraints such as building codes or manufacturing constraints on a part to be injection molded. For example, studs in a house align on 16-inch centers (and meet numerous other constraints), windows size and space themselves within building structural requirements, daylight code requirements, and building insulation requirements. Multiple steps adapt to meet the requirements for stairs. Pipes both size and connect to meet plumbing engineering requirements. For example, a toilet may be properly plumbed by tracing a finger along the desired 3D path, while the other hand rotates and moves the house so that the desired precise path is within reach and generated by an approximate path of the free fingertip performing the plumbing, such that appropriate pipes are generated and properly placed. An example from injection molding limitations includes minimum and maximum wall thickness, draft angle, mold interference, and other such predetermined constraints.

Yet another embodiment is the generation of an associated mating part. For example, selecting a screw, and placing the tip of the screw against the object causes threads to be created in the object, appropriate for both the screw selected and the material of the object. Such automatic creation of an associated part, if desired, ideally applies to all fasteners that might be selected. One example scenario might be for a user to select a latch type, such as a hook. Then, by placing this half of the latch in a location, the latch is sized, and a correct material is selected, and a mate for the hook, such as a detent, is created opposite. If the hook and mate are each part of respective injection molded objects, they are then integrated into the object. Haptic feedback or an animation may be immediately used to test the latch and mate.

Of course, many exiting user interface analogs, such as parts drawers, cabinets, sliders, buttons, panes, and the like are readily implemented along with the novel embodiments of this invention.

In one embodiment, such traditional UI conveniences show up only when desired, such as a disappearing apps dock, only in 3D. Using two hands to work with such traditional UI elements is a novel improvement. For example, a large set of panes or library shelves might be represented as cards in card deck. One hand flips through the card deck, either slowly or rapidly, as the user already knows how to do with real cards, while the other hand easily selects the desired card, that is, a two-dimensional pane of choice. Similarly, drawers may be represented as a wall of drawers, with both hands opening and closing drawers to hunt for the desired item, much as one might look for a clean pair of socks in the morning. A virtual push with a vertical, flat hand, makes the wall of drawers go away, just after the other hand timely lifts a desired element or tool from a drawer. Exemplary actions such as the just described card deck and wall of drawers use both hands, in one or more cooperative gestures, mapped from the space of the hands to specific 3D CAD system functions.

Yet another embodiment uses physical analogs to alter the viewpoint of the user. For example, climbing up a ladder increases the height of the user's view. Ladder elements, such as feet and rungs, are visible in the workspace as the user climbs. The ladder and the rungs of the ladder are further examples of integral fiducials. The number of visible ladder rungs, and perspective of the base of the ladder provide the inherent dimensionality of the user's workspace. Virtual lamps are grasped, moved and rotated as desired to provide adjustable light for viewing the object. In an example of two hands in a coordinated gesture and posture, the right hand holds (posture) or moves (gesture) a flashlight, while the left hand holds, rotates and tilts the object being viewed. In such an example, all six degrees of freedom of each hand may be used. Relative motion between the hands, or between the hands and the body, may control, for example, the zoom or magnification desired. Changing the diameter of the handgrip on the flashlight may control the brightness of the flashlight. An analog of a tripod may be used to mount a "camera," where the camera analog defines a viewpoint. Some embodiments are free of "floating" viewpoints, "floating" objects in space, or free from both. Floating viewpoints are the norm in prior art. Floating means not visibly fixed to an analog of a real-world physical object. An analog of standing on an outdoor scenic viewpoint, or on a roof, may be used to get a large overview, such as looking at multiple parts, or elements from a library. Looking into or out of different windows in a building may be used to view different objects, parts, or library elements. An analog of looking out a window may be similar to a view of a playground, where the play equipment is tools or parts. An analog of looking into windows may be seeing articles in a window display of a store. Viewpoint analogs include but are not limited to: ladders, stools, chairs, towers, hills, roads, bridges, roofs, diving boards, ski slopes, airplanes, wells, stairs and the like. Diffuse light source analogs may be strings of Christmas lights.

Yet another embodiment causes the visibility of tools to fade in and out as needed, automatically. Such automatic visibility adjustment has several forms. One form is proximal location. For example, as a hand moves closer to a virtual lamp position, an image of the lamp becomes visible, at first partially transparent, and then opaque as the user's hand is in position to actually adjust the lamp. As the user moves her hand away, after adjusting the lamp, the lamp automatically disappears. Another form of automatic fade is based on user experience. Novice users are offered more visible tools and other virtual elements, such as a tabletop, vice, drill bit, or saw blade. Experienced users are familiar with tools and the current mapping of hand gestures and poses, and so associated tools either never appear, or fade in and out much more rapidly. A third form of automatic fade is based on the user's actions. For example, a user that pauses, or moves slowly, causes the current set of tools and conditions to be visible. As hand motion is increased, or gestures or poses become recognized by the system, such tools and conditions fade—typically to expose more of the object to view. Examples include a visible tabletop and a saw blade. If one stops sawing, the blade becomes visible. If one starts sawing, the blade fades so the slot being created is fully visible.

Yet another embodiment is the use of gestures and poses to create adaptable constraints. For example, holding an object with one hand might keep it locked in a position. However, it is useful to put an object in a vice, tighten the vice, and have the object stay locked in position, that is "in the vice," until the vice is later loosened. In this way, the hand that implemented the constraint is now free to perform other actions. Of particular merit is the use of variable constraints. For example, the use of a physical vice locks the object against all six degrees of freedom. However, the use of a vice as a physical analog may permit only a single degree of freedom, such as rotation around a vertical axis, and lock others. Gestures and poses may be mapped to quickly implement this desired, "customized" constraint. One such embodiment is the use of selecting an object that represents the desired degree or degrees of freedom. For example, selecting a pole and placing it next to the vice sets that the only desired degree for freedom is the one naturally associated with a vertical pole. Placing a tabletop next to the vice indicates that only X and Y motions are now permitted by the vice. Placing a ball next to the vice indicates that all rotations are permitted, but no translations; whereas selecting a cube does the opposite. The constraint analog is not necessary a vice. It may be simply a hand holding the object. One constraint is maintaining wall thickness, as other aspects of an object are modified. Another constraint is maintaining compliance with a set of rules or specifications, as other aspects of an object are modified. For example, an existing object may have passed some strength tests. The 3D CAD data of that object may then be modified while maintaining the existing strength. For example, as the object is enlarged by the user, wall thickness is automatically increased so as to maintain the original strength.

Yet another embodiment is directed to having "layers" within a 3D object that have different characteristics, particularly with respect to permanence and plasticity. For example, a user may have used "bricks" to build a wall, however, the wall of the object is not to be made from bricks, but rather is a portion of a shell of an injection-molded part made of plastic. In one form of this embodiment, the user "smooths" the surface of the brick, for example, by rubbing it with her hand, removing all trace of the brick joints: the fiducial marks from the bricks. In this way, the wall is made homogenous.

In another form of this embodiment, the user "covers" the bricks with another material, such as an analog of plaster. The bricks, that is, the fiducial data, may remain, hidden, under a cover layer, until later removed. Or, once covered, the bricks, that is, their visible fiducial data, are removed from the object data. This form of the embodiment is useful, for example, if the wall thickness is no longer desired to be uniform, as it was when it was first created from "bricks."

This embodiment of having unique "layers" within the object has many forms. For example, all parts of an object may be constrained, except for one side. That side can be made "rubbery." Thus, hand pressure or motion against that surface will deform it in a way dependent on the parameters selected. In this way, a flat part surface may easily be made to be gently curved, such as might be desired on a handheld product or for a more organic shape. Rather than a long, complex selection of curves and radii, the user simply presses against the side to achieve the desired curvature.

One form of a "layers" embodiment is that the uppermost, last-placed, or most-outside layer of integral fiducial elements is easily alterable, such as malleable or easily removable, while rest of the integral fiducial elements are relatively fixed. For example, consider a simple, straight wall of bricks being built by the user dripping bricks from her fingertips. The bricks self-assemble, making the wall perfectly uniform, except the top layer of bricks. This top layer of bricks is soft and formable, so that they user may easily alter this layer, like soft clay, with her fingertips. If a brick from this top layer is removed, then the brick underneath becomes so malleable. The integral fiducial marks, the joints between the bricks, remain visible. In the placement of a "brick," the available dimensional increases of the object are quantized. For example, if a brick being used is 2" by 4" by 8", then the height of the wall is increased in 2" increments. However, if the top layer of bricks is easily malleable, then the user can easily alter the last 2" of wall height. The top of the wall may be then sloped at an angle, curved, or shaped in other ways. That is the most accessible layer of the quantized integral fiducial elements may be easily modified to any arbitrary dimension or shape. This particular embodiment removes the limitation of quantization from the object being built, and yet still allows the user to see dimensionality, by the joints between the elements, for example. The self-assembly embodiment of using integral fiducial elements allows uniform, "perfect" structures to be created using a free-form method, such as dripping, patting, throwing, and the like with the user's fingers, hand or hands. As described in this simple example of the top of a brick wall, the generalized embodiment applies to desired portion of the wall, such as an end or face.

A user may slope the top of the wall using a mason's trowel, or her bare hand. This sloped portion may be then made straight by placing a string line next to it. It may then be made level by placing a level next to it. As another example, a gutter or driveway may be appropriately sloped by pouring water from a bucket onto it.

Yet another embodiment uses non-uniform magnification in the view. For example, angles from vertical may be enlarged without otherwise changing object proportions. In this way, for example, small draft angles may be easily viewable. For example, such angles might be magnified by ten. Thus, a one-degree draft angle would appear as a ten-degree draft angle. While such distortions make it hard to work on an overall part, they are a fast way to check or modify specific dimensions, angles, thicknesses, and the like. In this way, holes may be magnified, wall thickness exaggerated, or curves exaggerated. For example, the desired, ornamental, "bulge" on a product wall described above could be magnified a factor of two to 50, In order to both easily see and create its shape. The portion to modify is first selected, such as by placing a palm against it, or outlined the line, area, or volume with a fingertip. Then, spreading the hands, palms facing each other is used to enlarge the dimension, characteristic or parameter of the selection. In one form of this embodiment pressure on a portion of an object or hovering next to a portion of an object cause that portion to enlarge, or for the viewpoint to zoom in close. A pose maybe used for this, such as three fingers closed, touching the portion of interest.

Yet another embodiment implements "organic distortion" of an object, using one or both hand motions. One might think of this as the 3D CAD UI analog of building a sand castle with one's hands, or forming a clay pot on a potter's wheel. However, a unique advantage of embodiments is the ability to specify, either in advance or via a hand gesture or pose, specific constraints on the distortion. One such constraint is to maintain symmetry, in any desired axis or dimensionality. Another such constraint is to maintain wall thickness. For example, a wall might be first created using "bricks," as described above, which generate a constant thickness wall; then formed into curves by changing its attribute to mimic a rubber, clay or plastic; and then formed to a curve organically by using hands in an embodiment. The portions of the object that are not to be deformed, in this example, are so identified in the UI. For example, the perimeter of the wall may be held fixed, even as the shape of the wall, such as a bulge, is modified. One form of this embodiment is the use of a fingertip or fingernail to "scratch" a portion of an object.

Yet another embodiment permits a rotating tool such as a lathe or potter's wheel to hold a piece in rotation, while it is worked by the user. The lathe or potter's wheel is another example of a physical analog. A tool rest tool may be added to restrict one or more degrees of freedom of the user's free hand, or tool held in the hand, as would a physical tool rest.

Of course, exact dimensions are easily created first, or as a constraint, or after any action. An object might be created organically, free of precision dimension specifications. Then, when it is approximately the shape desired, precise, minimum, or maximum dimensions or other limitations are applied.

It is also possible to use quantified parameters first, then organically modify an object. A planned consumer product might start out as a brick shape of exact dimensions, then modified to have a more pleasant, organic shape, while maintaining or adding key constraints, such as wall thickness, reveal dimensions, and draft angle.

Organic distortion while maintaining some object constraints works hand in hand with the embodiments that use "layering." That is, a constraint layer may be created, such as a rectangular box. Then, a second layer is added to that that has more detail, such as trim, feet, latches, and curves. The first layer provides some constraints for the second layer. Then, a third layer is added that provides, for example, a higher level of detail, texturing, and other secondary features. Each layer has different parameters, such as dimensional constraints. Finally, all layers may be merged, to create, for example, a single injection molded part. Or layers can be "mingled" to provide an appropriate final composition, such as a residential wall with studs, drywall, and texturing. A layer may be deleted. For example, the original first "rectangular box" may be deleted, leaving only the second "shape" layer along with the third, "detail" layer.

In some cases, it is useful to think of, or use, temporary layers, such as constraint layers, as similar to physical "jigs." Note that when we discuss here, "layers," these are fully three-dimensional elements, not limited to two-dimensional elements.

Yet another embodiment permits certain elements to be locked consistent with specified constraints. For example, a screw hold may be placed that has exacting dimensions and threads. Then, the wall containing the screw hold is deformed organically. However, the screw hold itself maintains its exact dimensions and threads and its axial alignment. Thus, even as the wall is made curved, the screw hole remains properly functional. The user interfaces for such "locking" is an extension of the user interface that sets constraints. For example, a thumb may be placed against the desired element for a few seconds until locking is acknowledged, perhaps by a beep, color change, haptic feedback or other indication.

Yet another embodiment uses analogs of well-known physical object to indicate constraints or actions on an object. For example, placing a tabletop under an object (or the object on a tabletop) restricts vertical motion, that is, motion in the Z-axis. Placing a lazy susan under an object restricts motion in the horizontal plane, that is, motion in the X-Y axes, yet allows rotation around the Z-axis. Placing an object in a vice restricts all motion of the object, although such virtual vices may be modified to in fact permit selected motions. Placing an object in sand constrains both X-Y motions and rotations, although the object may be picked up. Such an analog as sand permits rapid changes from constrained to non-constrained. A hook analog may be used to constrain and permit motions similar to how a physical hook would work, such as a coat hook. One or more magnets may be used to temporarily couple parts. Conveniently, the magnets may have zero thickness, yet are visible.

Yet another embodiment provides for "squishy" constraints, permitting small motions that are plastic-like (not-restorative) or spring-like (self-restorative). Such squishy constraints are particularly valuable in direct manipulation of an object, such as deformation by a hand, to provide feedback to the user. For example, the equivalent of "pressure" on an object may be implemented by proportional movement of the object. Such squishy constraints may also be considered as "soft" constraints.

Yet another embodiment provides "wiggle" (automatic motion) or "jiggle" (caused motion) to indicate a particular part or relationship of parts. For example, a screw may wiggle in a screw hole to indicate that it is a fastener, even though the fastener as designed would be tight and not wiggle at all. Wiggle or jiggle may also be used to indicate that two parts are not connected to each other, or the opposite.

Yet another embodiment uses transparency to indicate constraints. A more transparent object may have fewer constraints than a less transparent object. Alternatively, a more transparent object has more constraints than a less transparent object. Although at first this latter relationship may seem backwards, it has the advantage that an unconstrained object, such as one being held in a free hand, is most visible, while objects not currently being worked on are less visible and thus less distracting, or minimally block the view of the handheld object. A form of this embodiment uses a time-relative "fade" of transparency in or out. Such fading provides smoother, more visible feedback of constraint changes and also permits a user to conveniently alter or undo an undesired constraint change. Sudden changes to transparency are not natural or intuitive, and thus are less desirable. Yet another form of this embodiment is that slow fades in or out permit a user to control a level of a constraint by stopping the change of constraint at the desired time by using a stop gesture. A form of this embodiment is the use of a pair of gestures or poses to direct more and less transparency.

Yet another embodiment uses an analog of heating or cooling, such as an oven or blowtorch for heating, and a refrigerator or ice for cooling. Such heating or cooling may change the plasticity of an object or portion on object, in the intuitive sense that heating softens and freezing, well, freezes. As an example, an ice cube may be rubbed on a portion of an object to constrain that portion from changing shape or dimensions. Such virtual heating may implement a corner or edge inside or outside radius. A useful constraint in this example is that all selected radii have the same radius value. Thus, the blowtorch physical analog may be used to melt a single location on an object, but the action is to change the radius of all edges simultaneously. A visual image of the blowtorch is initially visible, and then fades to transparent or invisible during use, so that the entire object is visible to the user as the use of the blowtorch continues.

Yet another embodiment uses an analog of water to alter the surface or an outer "layer" of an object. Such virtual water may be dripped, poured, rubbed, or sprayed, or the like. Or, the object may be fully or partially dunked. Such use of water may alter the visibility of fiducials or alter a constraint in the intuitive sense of "washing off" some aspect of the object. Such use of water may alter the surface of an object, or implement a corner or edge inside or outside radius, in the sense of "melting."

Yet another embodiment uses well-known materials as a starting point when a part with similar characteristics is created or modified. For example, a rigid part may first appear as steel. A flexible part may first appear as rubber (e.g., black). A part that is later to be deformed may first appear as plastic (e.g. transparent or translucent). A particularly soft part, such as one that is going to be organically deformed, may first appear as clay or sponge cake. Using different material analogs for different "layers" of a part, as described elsewhere herein, or portions of a part, is a particularly good use of such analogs. A fixed portion may be shown as steel while a portion to be modified is shown as cake.

Some embodiments use whole body motions or arm motions in addition to hand gestures and poses. For example, bending over to pick up an object off the floor, or standing up to pull down a window shade. Placing an object on a windowsill may make it available to others. Yawning may be used to save and close a file. Sneezing or blowing may be used to erase or delete.

Haptic feedback is not a requirement for most embodiments. However, such feedback is desirable, for example, to implement an analog of hand or finger pressure, or material properties. Haptic feedback includes many forms, such as pressure, vibration, impulses, temperature, firmness, electrical stimulation, and the like. Embodiments may use haptic feedback in intuitive, natural analogs. Embodiments use haptic feedback in unusual, non-physically analogous, mappings. For example, amplitude of vibration may indicate wall thickness at the location of a fingertip. Pressure or temperature feedback is useful to indicate constraints.

In one embodiment, locations may be defined by "poking" an object, such as with an index fingertip, or with an icepick.

Yet another embodiment includes tool modification consistent with the way objects are modified. For example, a two-handed grasp and pulling coordinated gesture may lengthen an object. The same gesture may be used to lengthen a saw blade tool. Pinching may shrink a component of an object. Similarly, pinching may change the tooth spacing or width of a saw blade. This consistency of object modification and tool modification is a particularly natural and convenient 3D CAD UI element, yet is novel.

Yet another embodiment is the use of specific gestures for repeating an operation or set of operations, and also for undoing an operation or set of operations. For example, an index finger clockwise rotation indicates repeat, while an index finger counter-clockwise rotation indicates undo. A novel variation of this embodiment is that changes to the gesture, such as a larger circle of the finger indicate a wider scope of the repeat operation. Such repeat and undo functions may be modified by additional gestures, such as pointing to where an additional drill hole should go.

Although repeat and undo keystrokes are common on keyboards, it is desirable to have keyboard operations mapped to hand gestures and poses, so that a user does not have move back and forth from free hand operation of the UI to use of a keyboard.

One embodiment lets users select their own mapping. For example, a user may type a known key sequence or perform a mouse-based operation first, then indicate which one or more gestures or poses should map to this operation. In this way, users who have already learned one UI, such as one that uses a keyboard and mouse, can gracefully transition to the more efficient UI of embodiments of this invention. A variation on this embodiment shows, on a screen, a set of recommended gestures or postures in response to a user provided keyboard or mouse sequence. The user may then choose one of the suggested. This option provides more consistency of the UI mapping from one user to the next, and likely provides a more cohesive and consistent mapping set.

One embodiment maps American Sign Language (ASL) finger spelling (note this includes both poses and gestures, such as J and Z) to keyboard letter commands. Another embodiment maps ASL to the first letter of (or next best choice) a command, tool or location. Yet another embodiment maps ASL words to associated meanings. For example, the gesture for, "up," indicates the top of an object or that a tool should be oriented, "up." A great many references and actions may be so mapped, including down, left, right, in, out, faster, slower, upside down, spin, and many others.

One embodiment uses gestures in the following way: one hand controls the object, while the other hand controls a tool. Another embodiment uses gestures in the following way: one hand controls the object while the other hand controls the view or working environment.

A key embodiment uses gestures in the following way: one hand constrains the object, including selective, predetermined or rule-based constraints, while the other hand performs an operation on the object.

A key embodiment uses gestures in the following way: one hand identifies a tool while the other hand sets parameters of characteristics of the tool.

Embodiments include traditional adding, removing, and binary operations on shapes, as well as the design equivalent of additive manufacturing and the design equivalent of subtractive manufacturing. Embodiments include all traditional 3D CAD operations.

Embodiments include modal mapping of gestures and poses. A gesture map may be specific for a mode. Thus, a fixed entry in a gesture map does not restrict that gesture or pose from having a different meaning in a different mode. Similarly, different objects or parts may have different gesture maps. However, it is worth noting that the less modal a user interface, the easier and more intuitive it is to learn and use. Certain gestures, such as stop, pause, move, more, repeat, undo, or help are expected to be strongly modal.

DETAILED DESCRIPTION

Figure 1:
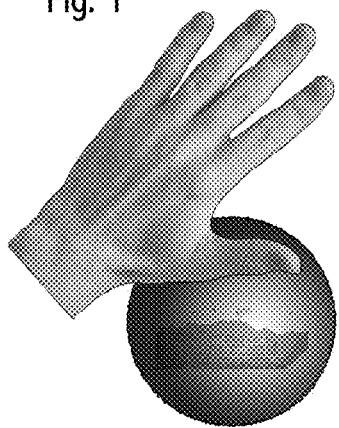
FIG. 1 shows an exemplary user hand in the workspace.

The 3D CAD system environment includes what is sometimes called a Virtual Reality (VR) development environment.

Methodology for implementing maps from hand gestures and poses to 3D CAD system actions or commands is not hard. The most current 3D CAD system commands are listed starting with the most common. Experienced 3D CAD system users are then asked what hand gestures and poses they think best represent those commands. Consensus or majority choices are then used in an initial mapping.

Similarly, people experienced in gestures, such as either experienced or new users of American Sign Language (ASL) are asked what they think the 500 most common words and letters should do in a 3D CAD system. Consensus or majority choices are then also used in an initial mapping.

In this way, the proposed mapping is approached "from both ends."

Beta users then validate and modify this initial mapping. The beta users set should include both experienced and new uses of 3D CAD systems. It is important to use new users for this purpose because a major benefit of embodiments is a faster learning curve. It is not appropriate to ask only those people who have already adapted to the convoluted, complex and arbitrary prior art 3D CAD UI what is "intuitive."

The above methodology will provide quality mapping for at least 90% of user actions. The remaining 10% may come from focus groups of 3D CAD users, who already have good experience using the initial mappings. Certainly, a forum could be created where existing users upload and comment on suggested gestures, poses and mappings.

There are many ways to determine the most common and critical 3D CAD commands and tools. One such method is to follow an introductory course in an existing 3D CAD environment, such as software by Autodesk®, Adobe Systems®, Blender, Unity3D® and UnrealEngine and many others. https://en.wikipedia.org/wiki/List_of_3D_modeling_software provides a list of 3D CAD modeling software. As each command or tool is introduced in the course, a map entry is created, starting the most obvious and most common hand gestures and poses, as determined by the above methodology. Such introductory courses are available on youtube.com and in US community colleges.

The 3D CAD system environment includes operations that do not directly modify an object, select or modify a tool, or control view. For example, setting user preferences, loading and saving work or a user environment, executing undo, asking for help, communication or sharing with other users, and the like. However, there is no bright line distinction between such categories of commands.

Useful hand gestures may be found here: http://www-.scienceofpeople.com/2015/08/how-to-speak-with-your-hands/.

Many named gestures are well known by name and do not need to graphically shown. Useful hand gestures, at least some of which should be mapped in embodiments, include:

listing;
count;
a tiny bit;
pay attention ("listen up");
fist;
fist gestures;
everything;
small, medium, and large;
fingers of both hands touching;
index finger motions;
palm motions of one hand;
palm motions of two hands;
pinching;
squeezing;
opening the hand;
hands moving towards each other;
hands moving apart from each other;
fingers interlaced;
extended hand;
fingers towards the user;
fingers towards the object;
turning a doorknob;
"this and that"—fingers in different directions
"distant"—one hand close, one hand far;

fingers up, hand in circular motion;
palm up, fingers spread.

Although the above gestures are well known and their usage in a 3D CAD UI is logical, we make comments below.

Listing—use of two to four fingers of one hand extended outward. This is useful for identifying items in a list, such as a set of multiple parameters. As an example, selection of a screw might require specifying the type, thread and length. This listing pose may be used to delineate the specification of each parameter in turn.

Count—Digits and multi-digit numbers from ASL hand poses may be used to provide numerical input or to specify a position in a list.

A tiny bit—This gesture or pose may be used to indicate "smaller," or to select the smallest available.

Listen up—This two-handed gesture may be used to move out of a lower-level interface or mode to a top level, such as the highest-level menu. This gesture may be used to bring up an over-layer or "manager" interface.

Fist—Indicates not only stop, but that the system has made an error. May be used as an emergency stop signal, interrupt, or escape.

Fist gestures—fist gestures, particularly two handed fist gestures or fist gestures using the non-dominant hand are particularly useful for indicate constraints. Direction of fist motion may be used to indicate specific constraints, such as motion direction or rotation.

Everything—This gesture, two hands moving from palms up to fingers out, may be used to indicate, "all."

Small, medium, large—The height of a horizontal hand may be used to indicate a one of a set of choices or a number within a range. Relative scalars may also be indicated by the spacing of two facing palms, held either vertically or horizontally.

Fingers of both hands touching—May be used to indicate closure or completion, connecting parts or objects together, merging parts or operations, or completing a sequence or operating mode.

Index finger motions—a large set of index finger motions are well known, including "up," "down," "right," "left," "away," "towards," and "rotate" clockwise or counter-clockwise, which may be used to repeat, set rate, drill, speed up or slow down or undo, depending on context, mapping or finger axis direction. Distinctions for finger rotation may depend on where the finger is pointing, of which there are roughly six options. Not also with two hands, the number of possible mappings at least doubles. Use of one of these finger poses or gestures with both hands at the same time triples the number of possible, non-modal operations available.

Palm motions of one hand—a set of palm motions are well known, including palm vertical for stop; palm horizontal for pause or maintain; palm up for more; palm pushing away to increase distance, such as moving an object more distant; palm moving towards for the reverse; palm vertical, hand moving left or right to implement the matching object displacement motion; palm horizontal, hand moving up or down to implement the matching object displacement motion; palm vertical, with a "pass by" motion to indicate more options, such as a menu scrolling; palm vertical, fingers out, rocking back and forth to indicate some small motion or alternatives; this might cause parts to operate in a dynamic way, such a latch to operate or a screw to screw in. There are additional well-known palm motions.

Palm motions of two hands—a set of two-palm coordinate motions are well known, such as "closer," "more distant," "taller," "shorter," and many others. These two-handed gestures are good for menu, tool and environment options, where one hand is not needed to provide an object constraint.

Pinching—generally means smaller.

Squeezing—is a particular type of smaller, such as a reduction in diameter, or a secondary parameter being reduced. It may also be used to indicate compression force.

Opening the hand—may be used as the opposite of squeezing.

Hands moving towards or apart—may be two-handed palm gestures. There are also hands moving towards or apart that are not palm gestures, such as with fingers extended or in fists. Two closed hands moving towards or apart may indicate relative movement of relative objects, such a joining or a change of spacing.

Fingers interlaced—there a multiple poses and gestures involving interlaced fingers. In one mapping this indicates combined operations, such as macros, or repeating sequences.

Extended hand—as if about to shake hands. This may be used as an acknowledgement.

Fingers towards the user—this may be used to indicate that the mode or following gestures or poses are relative to the user, not relative to the object, for example. This gesture or pose may indicate a user preferences mode, setting of environmental parameters, or changing view.

Fingers towards the object—this may be used to indicate that the mode or following gestures or poses relate directly to the object.

Turning a doorknob or faucet—such analogs may be used to provide continuously adjustable parameters. Most people find the natural motion of turning a handle provides more resolution and control than moving a slider or mouse. Multiple handles, such as "hot and cold," may be used to adjust multiple related parameters, such as diameter and length (e.g., for a hole, drill or fastener); or width, depth and height. By using two hands at the same time, two parameters may be controlled simultaneously. An analog of a joystick may be used to control numerous parameters simultaneously with a single hand. Ideally, for a complex analog, a 3D image of both the hand(s) and the analogous control object(s) (e.g., faucet handle or joystick) are shown on a screen. More advanced users may prefer, however, to not clutter a screen with this imagery. Sports gestures, for some users, are useful analogs.

This and that—hands in a natural position with fingers pointing in different directions may indicate more options are needed, or help is requested. This may also be used to indicate a change to view mode options.

Distant—one hand close to the body and one hand far may be used to indicate a tool change, or other change from current mode, view or operation. It may be used to indicate, "next."

Fingers up, hand in circular motion—may be used to indicate, "more," or "continue," such as scrolling through menus.

Palm up, fingers spread—may be used to indicate help requested.

Above comments and descriptions are not necessarily part of any embodiment, but are provided as non-limiting exemplary elements of mapping of embodiments. Embodiments are claimed using the above gestures, poses, and mapped actions as discussed.

It is important that mappings of specific free-hand gestures and poses to specific operations of the 3D CAD UI are not arbitrary design choices, but rather are selections to maximize the intuitive operation of the UI based on natural anatomical human features and attributes, and on user experience of using hand gestures and poses in human-to-human interactions.

It is important that many hand poses and gestures are not in fact "commands" in the usual sense of keystrokes, buttons and command keys, but rather they are used directly for object manipulation. Hands are used in the UI to hold an object, stroke the object, push on the object, identify locations on an object by touching, use tools on the object (such as saws, knives, hammers, drills, paintbrushes, and the like), stretch, shrink and deform the object or surface of an object.

Often a pair of sequential gestures or poses is mapped to a single action. Such use of pairs (or any length sequence) is included in the construction of a single "gesture" or "pose" in claims.

A key strength of embodiments is the natural use of hands directly on the object.

Embodiments also accept other input in addition to hand gestures and poses, such as voice commands, body language, eye motions, and the like.

Embodiments permit two or more users to work on the same object or in the same environment at the same time.

Turning now to FIG. 1 we see a schematic view of user's hand in a 3D workspace of a 3D CAD UI.

Figure 2:
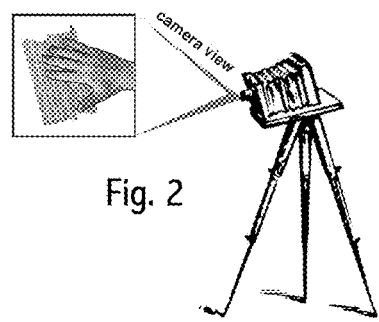
FIG. 2 shows setting an exemplary viewpoint using a physical metaphor.

Turning now to FIG. 2 we see first a physical object metaphor for setting a viewpoint. Here, a tripod and box camera are the analogous objects. Second, we see a user's hand working the surface of an object. The tripod and camera imagery and the user's hand and object imagery may both be shown on the screen at the same time. This is advantageous, for example, so that as the user adjusts the height of the tripod or the angle of the camera, the view of the hand and object changes simultaneously. Alternatively, only one imagery may be shown at a time. Note that this is an example of an embodiment of a "view of a view." That is, the view of the tripod and camera shows analogous elements that set the primary viewpoint of the object and the user's hands.

Figure 3:
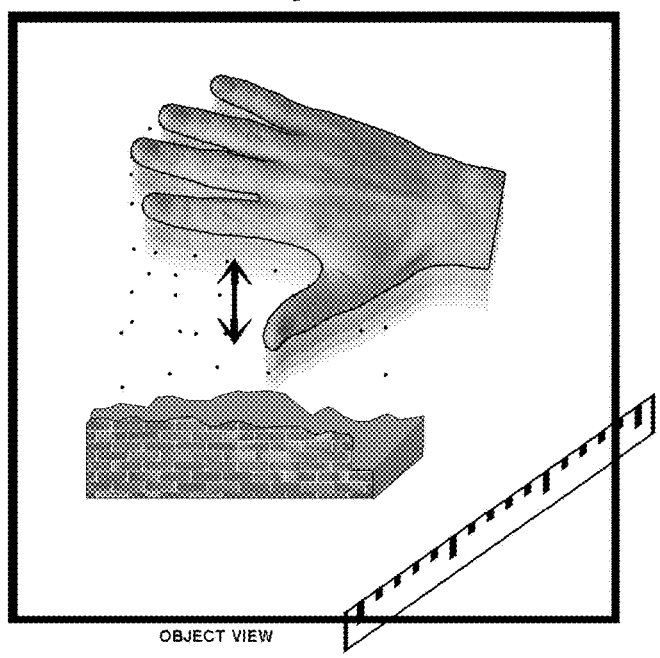
FIG. 3 shows an exemplary action of user's hand dripping integral fiducial elements onto an object.

Turning now to FIG. 3, we see exemplary snapshots of multiple embodiments, which are discussed in more detail elsewhere herein. The user's right hand is shaking integral fiducial elements onto an object. Alternatively, not shown, the elements may be dripped from one or more fingers. Fingers may provide a finer-grained level of build-up, while a whole hand shaking provides a faster, courser build-up. The arrow shows the up and down motion of the hand, which is a one handed gesture, mapped to the action of dropping integral fiducial elements onto an object. The object is shown as bricks, the integral fiducial elements, in a wall of substantial thickness. Although the thickness of the wall is not shown in the Figure, it is perhaps a dozen bricks thick as shown. In an actual implementation of this embodiment, the bricks showing the depth of the wall would also be visible, not constrained by the low resolution of patent drawings.

We see also in FIG. 3 how the upper-most layers of bricks are malleable. Here the user has shaped the top of the wall with his hands. Such shaping is not shown in the Figure, however the organic, smooth curves of the top of the wall show the result of such shaping. Note the realistic rendering of the bricks in the wall. This is an example of the strong intuitiveness and visibility of using physical metaphors for fiducials. Note in contrast, a ruler, lower right, in the Figure, showing the prior art of showing scale in a 3D CAD UI.

FIG. 3 also shows a self-assembly embodiment. Although the user is simply shaking bricks down upon the wall, they assemble into a well-constructed wall.

Figure 4A:
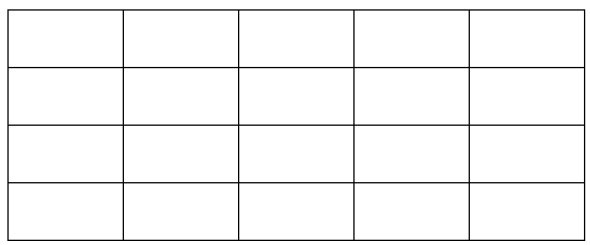
FIG. 4A shows a wall self-assembled from integral fiducial elements.

Turnings now to FIGS. 4A, 4B, 4C and 4D, we see another schematic sequence of using self-assembly of integral fiducial elements. In these figures, bricks are shown as mere two-dimensional rectangles for visual clarity in the Figure. Also, for these exemplary, schematic walls, the bricks are arranged in grid pattern, rather than a more typical offset brick pattern. FIG. 4A shows the wall as first created, such as a use dripping bricks from one fingertip (not shown in this Figure). Note the uniform construction of the wall.

Figure 4B:
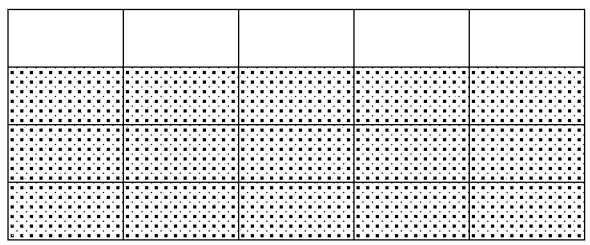
FIG. 4B shows the same wall with the upper layer of elements unlocked.

FIG. 4B shows all but the top row of bricks shaded. This shading informs us that these bricks are locked, or possibly have other constraints in comparison to the top row, which is relatively unconstrained. Here the top row is malleable with respect to the height of the bricks. Note that the thickness and surface location of the bricks in the top row may still be constrained so that shaping the top row does not cause the bricks to smooch out, as would happen with real, soft clay bricks. Typically the shading shown in FIG. 4B is not visible to the user. It is shown here for explanatory purposes.

Figure 4C:
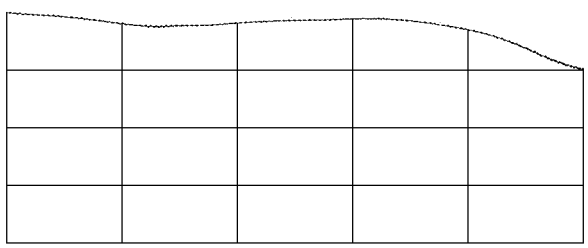
FIG. 4C shows the same wall with upper layer modified organically.

FIG. 4C shows the wall after the user has finished organically forming a top curve on the wall. Such deformation may have been done simply with the palm of the user's hand, as one might smooth the surface of a sand castle or the top of a soft clay model.

Figure 4D:
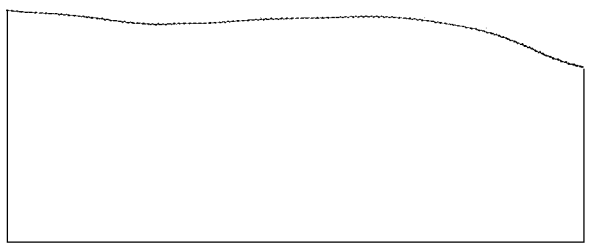
FIG. 4D shows the same wall with the fiducials removed.

FIG. 4D shows the finished wall with the fiducials removed. One embodiment of removing the fiducials is to simply wipe or smooth the surface of the wall with the user's hand. Such visible smoothing or removal may be gradual, or occur only under the user's hand as she works, rather than the binary on or off of prior art workspace grids. That is, the removal of the fiducials, like many other surface modification embodiments, mimics the natural physical analog of wiping a surface with a hand, cloth, or tool.

Figure 5:
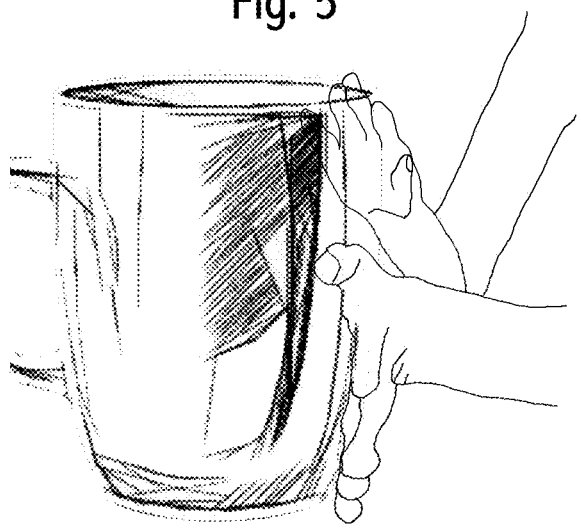
FIG. 5 shows one hand constraining an object while the other hand works the object.

Turning now to FIG. 5 we see an object being worked, here, a cup. The user's both hands are visible. Note however, an embodiment that renders the object differently from the hands. Here, the object is shown in realistic 3D, such as color and shading from multiple light sources, while the user's hands are shown in a schematic wire-frame or outline style. In this Figure, the benefit of the embodiment is visible as the focus remains on the object as it is modified, not on the hands.

In this Figure we see also partial transparency. The user's right hand is visible through the cup, even though the cup is clearly rendered.

In this Figure we also see an embodiment where the user's left hand is constraining the object while the user's right hand alters the shape of the cup. Although the user's left hand is placed against the cup, the chosen constrain mapping is such that the cup is held rigid. That is, the cup does not move away, even though the user's right hand is pressing against it.

In this Figure we see also another embodiment where there is a constraint on the cup of symmetry, excluding the handle. In this way, the user's right hand may form a curvature that is applied uniformly and symmetrically to the entire cup bowl, not just the portion under the user's right fingers. Such a constraint may be indicated by the user tracing a finger along the top of the cup.

Figure 6:
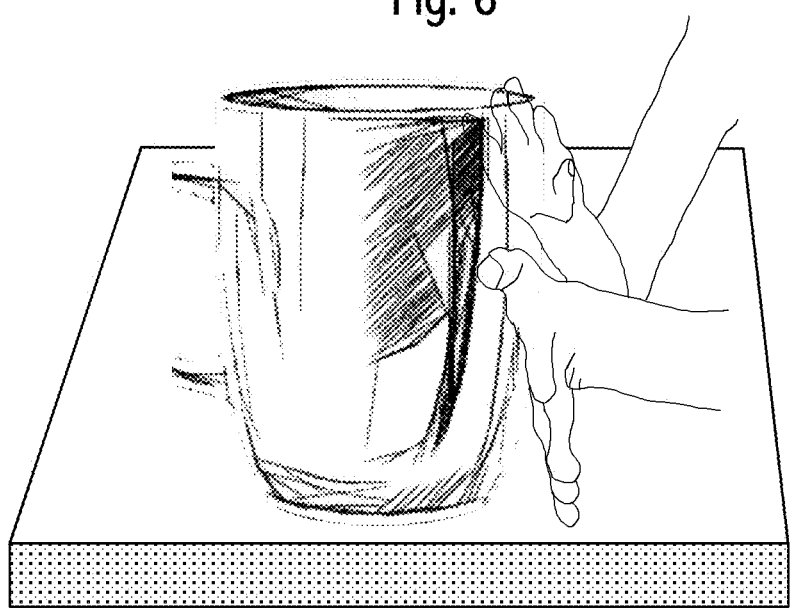
FIG. 6 shows the use of an analogous table to constrain an object while both hands work the object.

Turning now to FIG. 6 we see an embodiment using analogous objects for constraints. Here, the user has placed the cup on a tabletop. This particular tabletop secures the object from translation but not rotation. The user is now able to use both hands to work the object. The left hand may readily rotate the cup, periodically, as desired. Yet, translation movement is constrained. That is, the user's left hand is no longer being used to constrain the object as in FIG. 5.

Note the hand positions in this Figure compared to FIG. 5. Such hand positions in these Figures are merely illustrative. As any experienced potter knows, a patent line drawing is an extremely limited way to demonstrate how to create an object.

Figure 7:
FIG. 7 shows an exemplary cooperative pose using both hands.

Turning now to FIG. 7 we see an example of a single cooperative pose using two hands. Here, the pose is fingertips of both hands touching with the middle fingers upwards. If one hand were to move to a different pose or position, this particular cooperative pose would no longer exist. Many two-handed gestures or poses are cooperative; people have limited experience using both hand fully independently.

Figure 8:
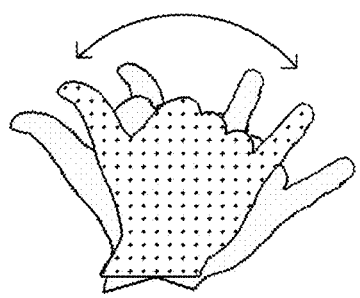
FIG. 8 shows an exemplary gesture of one hand.

Turning now to FIG. 8, we see an example of a one-handed gesture. The arrows show that the hand tilts back and forth in this gesture.

Figure 9:
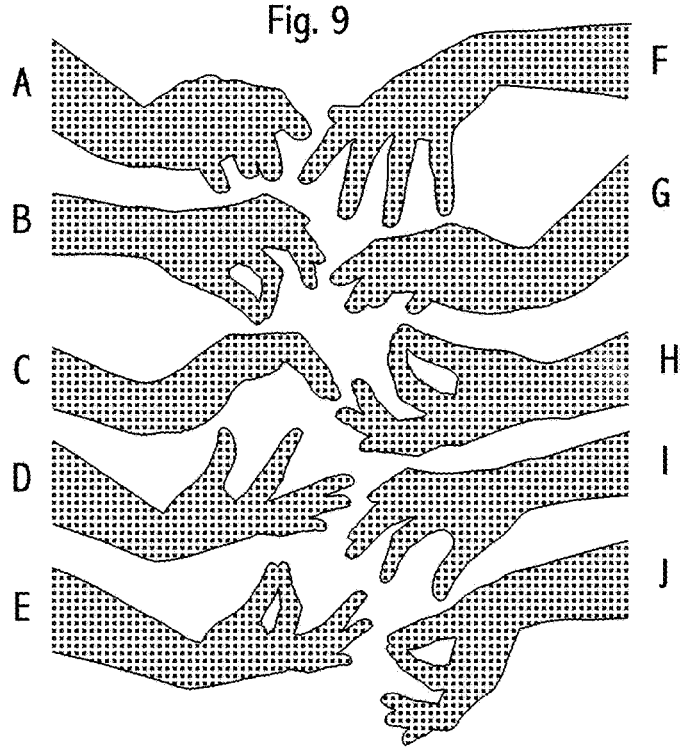
FIG. 9 shows 10 exemplary poses of one hand.

Turning now to FIG. 9 we see ten exemplary poses of one hand, in silhouette form. Note that the difference between poses B and H is palm up versus palm down. Note that the difference between poses H and J is the angle of the wrist.

Pose D changing to pose E may be a gesture. Here, this is a pinching gesture with the palm up. This might map to and action of shrinking a dimension, such as the diameter of a hole. Alternatively, it might map to the action of moving and joining two parts together.

Pose F, if the hand were to move up and down as a gesture, might be used to drip integral fiducial elements from the fingertips.

Additional Embodiments

Additional embodiments are described or summarized below. Some embodiments below are explained in more detail elsewhere herein. Paragraphs, for readability, do not use the form, "In one embodiment . . . " Nonetheless, that is the meaning of the text.

When the term, "hand," appears below, it refers to a gesture or pose of that hand, or a sequence, which in turn maps to an action.

One hand controls the view while the other hand performs actions on the object.

One hand alters fiducial visibility while the other hand performs unrelated actions.

One hand alters reference and analogous objects, such as a tabletop, while the other hand performs unrelated actions.

One hand provides object constraint, object position and object angle control, but does not alter the object, while the other hand performs object alteration, but does not alter object position or angle. In this mode, the same gesture or pose on one hand will often cause a different action than the same gesture or pose on the other hand because the capability sets of each hand are (mostly) mutually exclusive. Certain poses, such as stop or help, may still performed the same from either hand.

One hand provides view control, including viewpoint position, angle, and "zoom," while the other hand performs unrelated actions. This is valuable, for example, when performing a series of very precise, small actions on a large object. The first hand executes "fly in and out" to see various magnified detail locations, while the second hand performs the necessary object, materials and tool actions.

A "clay" mode permits a user to realistically add, remove and shape of the object by the gesture analogues of working with real clay. That is, rather than discreet gestures or poses, each mapping to a discreet action of command, the user simply works continuously pinching, removing, adding a blob, pressing, smoothing, and all other actions that might be performed with clay and a hand. The user may select and use common clay forming tools, such as wires, cloths, and numerous wood and metal shapers. Nonetheless, desired constraints apply, including potentially constraining object movement, or locking portions of the object so that they cannot be altered. Manually selected portions of "clay" may be hardened by the use of a blowtorch or heat gun analogous tool. Manually selected portions of "clay" may be softened by the use of analogous water. Note that the use of "water" may soften into the depth of the clay, unlike actual adding of water to the surface of physical clay.

Dimensional mapping of a hand to the object may be adjusted by the user. That is, a very tiny object may be manipulated and altered by making hands small or the object large, relatively. Similarly a large object may be manipulated and altered with a reverse ratio.

Of particular merit is when the size mappings are different for each hand. That is, one "large" hand might hold and position an object, while a second "small" hand performs detailed work on the object.

"Balloon" deformation is available. That is, an object may be deformed by "blowing it up" to make it larger, either with or without walls bowing outwards. The reverse action is also available. Nonetheless, constraints may apply, such as keeping an edge straight, or fasteners functional, or locking one or more dimensions. For example, a hollow cube may be created, then its edges locked, then blown up. The result is that all faces (or selected faces) would acquire a smooth convex curvature. An image of a balloon or a mouth blowing into a balloon may be used. A balloon may be a tool. The level of deformation of a face, or other part, may be a function of wall thickness. Or, it may be set separately. For example, wall thickness on a wall may be tapered or have thick elements, however, the desired deformation is as if the wall were uniformly thick.

Tools, as visible in a tool library, appear realistically as a physical tool, even as its operation and actions in the UI are more constrained.

A nexus of embodiments is the use of pose and gesture mappings to actions. Another type of map, a "location map," may be used that maps locations on the hand to locations on the object. One use of this map may be a filter. Non-mapped object locations are not altered by hand action, although they may be altered by other tools, and by actions of the other hand, such as moving, rotating or constraining the object. A second use of this map is scaling. In particular, non-uniform scaling may be used. The palm of a hand may map effectively as large, while fingertips map effectively as small. Non-mapped hand areas are useful when the hand is directly against the object, such as in manual shaping. In this way, only desired areas of the hand work the object. This may provide more specific haptic feedback to the hand or may limit modifying the object except by use of specific hand areas, such as one fingertip only, or the palm only.

People within a group of people may be assigned or restricted to specific portions of an object. They may also be assigned or restricted to specific tools or actions. For example, different parts of a sculpture may be assigned to different people. One person is responsible for the hands, one is responsible for the face, a third is responsible for body proportions, and a fourth for surface texture and color. In addition some of those "people" may in fact be algorithms or automatic actions. For example the role of the third person above may be set to automatic, so as the sculpture is modified, relative body parts remain proportional.

Some actions may be "requests," rather than actions. For example, an action of pushing on a car may be a request for the car to move forward. There may be various reasons why the car should not and will not move forward, however.

There are no restrictions, unless desired, on also using prior art 3D CAD UI functions and sensors.

It is useful to change material properties for different portions of an object. Of particular value are smooth variations. For example, the base of a coffee cup may be stiff while the upper portion is flexible and this parameter varies smoothly from base to top. This allows shape deformations, particularly organic deformations, such as the use of clay analogous material, to affect the top of the cup the most and the base of cup the least. As another example, deformation may be locked in one axis but permitted in another, or allowed to vary smoothly between the axes.

It is useful for a user to define, "macros," by observing, either forwards in time or backward in time, a sequence of actions and their effects. Then, the user selects the range or scope of individual actions or groups of actions to make up the macro.

A variation is to alter parameters of a prior action to see the effect, including then re-applying previous actions that were after the modified action. Note that it is quite likely that the re-applied actions perform differently than they did the first time, particularly if a modified action was a constraint.

Haptic feedback parameters may be altered, acted upon, or filtered, similarly to the way that actions on an object, tool, or viewpoint are performed. In particular, it is desirable that gesture and pose mappings, and the view of those in action, be as consistent as possible.

Although most embodiments use free hand gestures and poses, in some cases it is desirable to incorporate the use on non-free-hand gesture and poses. For example, a rubber pad may be used in order to accurately measure pressure of fingertips, palms, etc. The locations on the rubber pad may be mapped in various ways to the object. For example, for a coffee cup, the rubber pad may be wrapped around the cup in such a way that 100% of the pad maps to 100% of the surface of the cup.

Of course, there are no restrictions on prior art uses of keyboards, mice, tables, styluses, touch screens, and the like.

Fiducials on an object may be considered ornamentation, or a surface property.

Embodiments are nominally directed to the use of human hands of a human user. However, one supposes that feet could also be used, particularly if two hands are not available. One also supposes that the hands of the user might be instead paws of an animal. Perhaps a cat could request that food, water or a gate be operated in a way desired by the cat. Animals could perhaps be taught to operate weapons via embodiments of this invention. We are just saying.

Notes on Claims

The following comments on claims, as originally numbered, may be used, if necessary to maintain validity of a claim, construe a claim, or identify additional claimed embodiments. However, otherwise, these comments are exemplary embodiments only that in no way restrict the breadth of a claim.

For claim 1 and all other claims. For claims construction, the term, "gesture" should be construed, in at least one embodiment of a claim, to include "poses." This avoids the awkward, repeated wording of "gestures or poses."

Variations described may be embodiments different from the claim.

Nexus of claims is the working environment that is responsive to hand motions to alter or view a 3D object. Such alteration of or viewing of the object is the purpose of the user in the working environment. The "object" is a visual, and optionally haptic or audio, representation of one or more physical objects, such as a physical coffee cup; or an object that remains virtual, such as a character in a movie, game, virtual reality environment, or an operator environment, such as the driver of an automobile or any other conveyance or sports equipment.

A "free hand" means operating in air, with all degrees of freedom that a normal person, with a normal hand would have, when the hand is not touching any object. Position sensing objects, such as wearing a data glove or sensing ring, do not restrict the meaning of "free hand." Objects of decoration or convenience, such as wearing a ring or holding a pencil in the air do not restrict the meaning of "free hand." Note that some such objects may be electronic. For example, a user may be holding a stylus, a one-handed keyboard, or a smart phone. However, so long at least some hand gestures and hand positions are performable by the user and operated upon by embodiments, the meaning of "free hand" is not restricted. A hand that is not free includes, as an example, a user using a tablet stylus or phone stylus for it's intended purpose (as the filing date of this invention) as a stylus, which is generally touching its corresponding sensor (i.e., the tablet or phone), although stylus may be separated by some limited distance. A hand resting directly or indirectly on a rigid surface, such as using a mouse, tablet, or fixed-position touch screen, is not a free hand. Fingers in use on a keyboard, mouse, tablet, or touch screen is not a free hand.

A user may hold a device in a hand and the hand is still be a free hand, so long as the user is not unreasonably restricted from performing the necessary gestures or poses. Indeed, a phone may operate as a gesture or pose sensor, or part of such a sensor; although phones as of the filing date of this embodiment are too large for convenience of this usage of the device. Similarly, a one-handed keyboard or stylus held by or affixed to a hand may operate as such a sensor or part of a sensor. For example, a user may hold a stylus within the crease of the thumb.

Construction of claims does not require that every possible human hand motion or every possible human hand gesture accepted or used. Nonetheless, a significant portion of the user interface of the 3D CAD system must be operative from the claimed limitations. A portion of the user interface may still require some non-free-hand actions by the user.

Hand gestures and positions must be sensed for the invention to be operative. Any particular sensing equipment itself is not within the scope of this invention and claims should not be construed as requiring any such particular equipment. Sensing devices are well known in the art, such as data gloves, single or multiple cameras, accelerometers, and time-of-flight distance-measuring transducers (using either sound or light). Such a device may be built into another device. For example, a ring might detect and transmit the necessary position, motion, or both, to meet the sensing requirements, yet not interfere with the use and meaning of a free hand.

Gesture and pose sensors may be hybrids. For example, a ring, watch, or wrist device may contain an accelerometer, while a camera assists in gesture and pose detection. In particular, finger positions are well detected by a camera. Similarly, relative positions of two hands, such as fingers touching, and position of a hand relative to the user's body, are well detected by a camera. A ring, watch, or wrist device may contain a camera for this application. A ring, watch, or wrist device on one hand may communicate with a similar device on the other hand, either directly or indirectly.

Similarly, a smart phone may detect the necessary position, motion, or both to meet the sensing requirements, yet not interfere with the use and meaning of a free hand. Note that smart phone technology is challenging as of the filing date of this invention to not restrict free hand motion. Yet, a user could "palm" a smart phone, or otherwise hold it in such as matter as to not restrict at least some hand motions or positions. As of the filing date of this invention, a single smart phone is not capable of both detecting and being responsive to two-handed motions in a 3D CAD UI environment, even though the prior art of smart phones include both video cameras (including dual cameras capable of detecting distance of objects) and accelerometers. Such sensors alone are not within the claim construction of "responsive to" two-handed motion and gestures. A smart phone, in the prior art, has sufficient processing power, memory and display to implement at least some portion of a 3D CAD UI environment. However, such underlying potential capability is not more than a "general purpose computer," as of the filing date of this invention, and until such general purpose hardware is programmed to implement embodiments of this invention it is not within the scope of all claim limitations of any claim.

Brick walls may be self-assembled in any known arrangement of brick walls, including offset, aligned joints, herringbone, flush wall edges and corners, such as rotating end-bricks of alternating rows, or cutting bricks (e.g., in half). Bricks are a metaphor for inherent fiducials, that is, to see the dimensions and build progress of a feature of an object. Brick edges may have any lengths, and ratios of edge length may vary from standard bricks. A tile is a type of brick. Selection of assembly type may be predetermined, may be determined by hand pose or hand gesture, and may be altered after the self-assembly, that is, self-reassembly responsive to a different desired arrangement of the bricks.

Examples of informal structures that may be designed are a tree house, sandcastle, food presentation, and a tent. Of course, more formal and economically valuable structures may be designed such as buildings, medical devices, transportation products, engines, product shells or product appearance, and clothing.

The nature of design is crafting a representation of an object that will be built from the design. Thus, when discussing a non-temporary portion of an object or object in the 3D CAD UI environment, we are also, at the same time, discussing both the representation of the element and the element itself when the object is built.

A surface may be a type or color of cloth, or type of weave, for example, in an article of clothing.

Elements in a textile include thread, yarn, zippers, seams, edges, and other items whose shape is predominantly lineal. Elements also include such items as buttons, buttonholes, pockets, belt-loops, cuffs and other items that may be an element with either a general or specific pre-defined shape. For example, a "pocket" may be placed on a shirt, where the pocket is at first a generic pocket or a defined pocket from a library of pockets. That pocket may then be optionally altered after it is placed. This allows a loose design idea to be quickly realized. Then, individual elements are refined as desired by the designer.

Examples of constraints on clothing may be to maintain its shape within the general recognizable shape of a selected article of clothing. For example, cloth may be added to a shirt where the cloth self-assembles into a shape that remains a shirt, such as having a front, back and sleeves. Similarly for a shoe. Leather may be added but the self-assembling object remains within some (wide) bounds of a shoe. Shapes of the shoe may further constrained by the user, such as a child's running shoe, a woman's high heal, or a cowboy boot. Such "object shape" constraints may be applied, as other examples, to windows, airplanes, animal plush dolls, a hand-held medical device shell, or a kitchen knife. Constraints may include minimum or maximum material thickness, draft angle, or radius for example, for an injection molded part.

Examples of fasteners include non limiting: screws, bolts, nuts, nails, snaps, zippers, door, window and cabinet latches, magnets, snap-rings, buttons, ties, welds, crimps, press-fit, pin-and-socket, gaskets, compression fittings, staples, clips, ultrasonic welded seams, latches, glue, adhesives, sewn thread, hook and loop, electrical fasteners, charging connections, wire-nuts, earrings, piercings, sutures, medical injections, medical attachments, pipe fittings, concrete forms, foundation piers, earthquake hold-downs, window and doorway headers, runways, bicycle racks, locks, sports elements that mate (such as court surface and net).

Additional types of fasteners include data interfaces, such as switch ports, router ports, telecom ports, security monitoring, wireless transmitters, receivers, or transponders, safety connections (e.g. grounding), satellite dishes, optical data connections, password and other validation locked interfaces, specified protocol terminations; and the like.

Clothing includes traditional elements such as shirt, pants, dresses, sweaters and the like, and also includes accessories such as shoes, hats, belts, purses, and the like.

An examples of a mating part to a fastener is: selecting a button, then the user interface creates a matching buttonhole that is responsive to both the type and size of the button, and the material in which the buttonhole is being placed. Another example is: selecting an airplane, the embodiment then creates a runway of the proper material, length and strength responsive to the type of plane and the surface on which the runway is being placed. Additional examples are plebian, such as screws and matching threaded receptacles, including countersinks and the like. A receptacle for a nail may be no more than a mark on a piece of wood. Note however, that if structural constrains are added, then the nail hole may have to be a minimum distance from an edge of the wood, or the nail may be constrained to a type, size and length of nail that will perform for its intended purpose in the object.

Building codes are a type of structural constraint, such as stud spacing, or maximum number of permitted windows, pipe diameter, roof slope and the like.

A 3D CAD UI environment includes one or more users, that is, one or more human designers designing one or more three-dimensional objects or systems. The user interface in this environment comprises accepting user actions, in particular hand positions and motions; changes to the object—that is the current representation of the object, and feedback to the user, typically a change visible on a display device. It is not necessary that all three of these occur in every user action. For example, an action may not change the object, but rather change a viewpoint, selections, default settings, import export, and the like. As another example, some claims are directed to changes to the object that occur automatically, such as changes responsive to structure constraints, which may, for example, be delayed from a user action. One could imagine a user building a house. Suddenly, building codes change. The user interface then alters to building to remain compliant with new building code. As a third example, some user actions may not cause a change to a display. For example, a user might increase pressure of a fingertip. The pressure change is recognized by the user interface, but not necessarily shown in a display.

Embodiments are claimed for claim 1 where a two-handed coordinated gesture is construed to be gestures or poses using both hands at the same time, where the effect is different than if first one hand and then the second hand were to perform the same gestures or poses, but not at the same time. Here, the "effect" means the final effect, such as on an object that results from actions from entries in one or more gesture-operation maps.

The two-handed-gesture—operation map and the one-handed-gesture—operation map are not necessarily different or distinct maps.

Use of a map does not preclude use of modal information. That is, there may be more than one portion of a map that maps the same gesture; however, depending on current operating mode, the user, the object, previous gestures, or other factors one specific portion will be selected for mapping. One map does not preclude the use of another map. Map selection may depend on operating mode, the user, which hand, the object, previous gestures, or other factors. A "gesture" may be construed to be one more sequential gestures or poses.

Step pairs (a) and (b), and pair (c) and (d) may be repeated any number of times in any order. For each repeat, the "first action" and the "second action" may be different than for prior executions.

For claim 2. A selecting gesture may select a specific fastener or a faster type only. For example, a "screw" is an exemplary type of fastener and such type may be what is selected. Alternatively, a screw may be selected that includes attributes of a material such as brass, a form such as a flat head, a type such as a wood screw, a size such as size 6, and a length such as one inch. However, the claim limitation of "automatically appropriate" may be for the UI of the claim to automatically select any or all of the just stated exemplary attributes of the screw, responsive to the exemplary fact that the object comprises two pieces of wood, each ¾ of an inch thick. The exemplary mating element is then a pair of holes in both pieces of wood of the correct size and depth to receive the selected and now attributed screw, including an appropriate countersink in the top piece of wood. A user may then, in another embodiment, adjust the location of the screw and its mating holes as a single unit.

A fastener selected may be altered prior the placing step so as to be "appropriate" for the material and thickness of the object at the first location. Note that the first location may not be known until after the selecting gesture; thus altering the fastener may be required at or prior to step (e). Typically, only such minimal alterations are executed in step (e). Other attributes of the fastener are determined by the selection gesture, or by other factors.

For claim 3. "Mating" attaches the selected fastener to its appropriate mating element. For the example above, the screw would be placed into the hole and its function, as fastening together the two pieces of wood in the object, would be implemented. The screw would appear fully placed in the wood and the two pieces of wood would no behave as if they were so fastened. Such mating in step (f) may be automatic, such as responsive to step (c), or may be an action responsive to a gesture.

For claim 4. The "generating" may show the each elements emanating from a hand of the gesture. The "assembling" may show the each elements moving from the hand to their assembled locations on or in the object.

A variation of the embodiment of this claim is that "continuous" is construed such that the individual elements are not touching, but rather are consistently spaced according to a predetermined set of constraints. For example, the elements may be windows and they may be spaced subject to a building code, floors in a building, or other constraints. Note that such spacing still serves the purpose of integral fiducials. A second example uses street lanes as the elements, and the constraints comprise rules for lane spacing. Additional constraints may be a constraint that the lanes follow a predetermined path. A third example uses plumbing pipes, and the constraints comprise rules for plumbing and optionally additional constraints from pre-existing building elements such a walls, floors and toilets. Such exemplary plumbing pipes would be connected as an exemplary embodiment of assembling.

Continuous may be construed as woven material, or another arrangement of fiber in clothing.

A key aspect of the "assembling" in this claim is that the UI is free of a requirement that the user place individual elements on the object to create the assembled portion of the object.

The "identical" limitation in steps (g) and (h) applies as these steps are executed, or at the start of the step execution. The elements, once assembled in step (h) need not remain identical. Indeed, embodiments alter the elements after they are assembled.

Embodiments repeat steps (g) and (h), whose execution may overlap in time.

Embodiments include terminating conditions other than the generating gesture stops. For example, the assembling from the assembling step may be complete, or an error condition reached.

For claim 5. This embodiment alters the individual elements after they are assembled in step (h), creating a subset of these assembled elements, where the subset may be zero or all, and the elements in the subset have at least one attribute or attribute value that is different that the elements not in the subset. An exemplary attribute is a constraint. For example, elements in the subset may be movable, while elements not in the subset are not movable, once they have been assembled. Another exemplary attributes is plasticity. For example, elements in the subset may be alterable, like clay, while elements not in the subset remain rigid.

Claim step (j) may be repeated following each execution of steps (g) and (h). That is, the first subset may continually change as more elements are assembled.

One step (j) may be executed in parallel with other steps, similar to (j), except for a different subset or a different attribute or attribute value. That is, there may be many subsets with many different attributes being altered, following the assembly of what are originally (as they are generated) identical elements.

For claim 6. This is an embodiment that is a more complex version of claim 5. The second subset is a set of most recently assembled elements. For example, this subset may be the topmost layer of bricks, where bricks are the elements of steps (g) and (h). This embodiment is directed the continual re-assignment of objects into and out of the second subset, as more elements are assembled from step (h), as step (h) is repeated. For example, as a brick wall is assembled in steps (h), the second subset is always the topmost layer of bricks.

Another embodiment performs the re-assigning responsive to the location of each re-assigned element with respect to other elements. Since new elements may be added by the repeat of steps (g) and (h), the location of an element with respect to other elements may change, and thus re-assignment may occur once or more than once for the same element.

Another embodiment creates a subset, such as a third subset, based on the location of the elements, rather than the time they were assembled. As in this claim, elements in the subset may be re-assigned as necessary, as the location of the elements may change during or after repeats of steps (g) and (h).

For claim 7. The "showing" is an embodiment of the "integral fiducials" described elsewhere herein, such as the joints between exemplary bricks, plywood, plates, yarn, lanes or pipes. Predetermined two dimensions of exemplary pipe may be diameter. Predetermined two dimensions of exemplary street lanes may be width and thickness.

For claim 8. The "analogous physical attribute" may be a material property, an appearance, or both. For example, bricks as elements may be made out of brick and appear as physical bricks. However, the material may be plastic even thought they appear as bricks. Note that both material and appearance are readily altered by the user after the assembly step. This example may be logically extended to the additional examples of plywood, plates, yarn, lanes or pipes. For example, plywood may be used construct an arbitrary surface (including optional thickness) or stacking plates used to construct an arbitrary vertical cylinder. Note that parameters of the assembled portion of object may be readily altered by the user after the assembly step. For example, the dimensions or thickness of a "brick" wall may be so altered, or the size of yarn may be so altered.

Additional embodiments include only one of the two limitations in this claim.

For claim 9. Exemplary structural elements are three-dimensional wood or steel studs for a building. The predetermined two dimensions may be the cross section of the structural element. The assembling automatically may comprise automatically selecting a length and spacing of the structural elements with predetermined constraints comprising building codes and a necessary structural strength of a building under construction by the user of the UI, using known formulas and algorithms to determine strength.

Additional embodiments include removing the limitation of two predetermined dimensions and adding a limitation of a specific material and structural type, such as exemplary gas plumbing pipes or electrical wire, where the IU automatically selects exemplary parameters such as pipe diameter or electrical wire size, subject to the constraints of building code and the requirements of a building under construction in the UI by the user.

For claim 10. Two exemplary structural parameters are the dimensions or quantity of studs, which alter responsive to exemplary increased load that the studs must support. A third exemplary structural parameter is the diameter of water pipe, which alters responsive to additional water-flow requirements such as an additional toilet in a building under construction in the UI by the user.

Additional embodiments include removing the limitation of two predetermined dimensions and adding a limitation of a specific material and structural type, such as exemplary gas plumbing pipes or electrical wire, where the IU automatically selects exemplary parameters such as pipe diameter or electrical wire size, subject to the constraints of building code and the requirements of a building under construction in the UI by the user.

For claim 11. In simple English, one hand holds the object and the other hand works the object. Such holding might constrain all six degrees of freedom of the object, or only a subset of these degrees of freedom. The gesture or pose that constrains the object may be simple, such as touching the object or holding a closed fist with the "holding" hand. Once so constrained, the constraint may remain after the constraining gesture or pose ends (such as the gesture of tightening a vice handle), or the constraining may remain only as long as the constraining gesture or pose remains (such as the pose of holding a closed fist).

For claim 12. Yet another embodiment is similar to claim 10, substituting "first kitchen tool" with "first shop tool" and substituting "the object is other than food," with "the object comprises other than a material for which the first shop tool was designed to work."

In yet another embodiment, a kitchen tool may be a spoon. The spoon is used in subsequent gestures to add or subtract value of an object attribute in unitized quantity, where the unit of addition is one spoonful of that attribute. For an example, a spoon that holds one mm of distance may be used to add increments of one mm to a dimension of a portion of an object, using a gesture of emptying a spoon. The spoon analogous tool may also be used to reduce the value of an attribute.

For claim 13. An exemplary attribute of the pair of glasses is magnification. Another exemplary attribute is "zoom out." Yet another exemplary attribute of the pair of glasses allows the user of the UI to see one or more object attributes, or hide from view one or more object. Exemplary object attributes including seeing integral fiducials, seeing a wire frame, and adjusting a value of object, tool or hand transparency.

For claim 14. Altering transparency is making an object, hand or tool more or less transparent. Additional embodiments replace the word in the claim, "tool" with the word, "object," or the word, "hand." Transparency is altered, in one embodiment, smoothly. That is, there are many more steps of transparency that two: opaque and not transparent, and there is a monotonic relationship between the speed of one or more gestures and the value of the transparency. "Speed of one or more gestures" may comprise the speed of execution of one gesture; the length of time a pose is held, or the timing of a sequence of gestures or poses. The concept, as explained elsewhere herein, is that more experienced users see less clutter on a screen. Experience may be determined by speed, as in the claim, or may be determined, in other embodiments, by the number of times a user has used one or more gestures or poses.

For claim 15. "Analogous physical objects," as explained elsewhere herein, include exemplary ladders, tripods, chairs, tables, stairs, elevators, scenic outlooks, and building roofs. Including a portion of such exemplary objects in the user's view in the UI provides a natural perspective and scale. For example, seeing rungs of a ladder or a portion of cityscape from a roof. Such displayed portions may be outlines, have high transparency, appear behind the object, or otherwise are not unreasonably distracting to the user, while still providing the desirable perspective. Exemplary actions such as climbing a ladder changing the floor of an elevator provide a convenient, natural analog of changing a viewpoint.

For claim 16. In plan English, claim 16 makes an object or portion of an object more transparent when a user's hand is distant, and less transparent when the user's is close. This is particularly valuable when the object whose transparency is being altered is in a larger object, or in a group of other objects. This permits an object that is being worked, about to be worked, or identified or selected in some way by some portion of the user's hand to be more visible with respect to the rest of the object or other objects. This is particularly valuable when the object of interest would be obscured by parts of an object or other objects if those were not transparent. In preferred embodiments, the change in transparency is a smooth function monotonic with distance, including distance to other parts of the object or to other objects. One might think of this as a user's hand having a diffuse "aurora" around the hand. As this aurora overlaps in space with portions of an object, those portions become less transparent, as a gradual change with distance.

For claim 17. A set of constraints may comprise, for example, a minimum wall thickness. Without this constraint, a user's gestures, such as accepted in steps (a) and (c), may alter the object such that a wall of the object becomes thinner than the minimum in a constraint. However, with the exemplary constraint. the constraint block, limits, filters or modifies the actions(s) responsive to the gestures such that the wall thickness does not decrease below this minimum. As explained elsewhere herein, a set of constraints maybe complex, such as a building code or structural computations. An object may be part of another objects and constraints may be relative to other objects.

For claim 18. This embodiment is directed to a surface of an object, of some depth, being an "outside" portion of an object. This outside portion has a different attribute than the rest of the object. One exemplary attribute is that this portion is moveable, removable, or malleable. For example, it may smoothable, similar to soft clay, while the remainder of the object is rigid and not malleable. Construction of the term, "outside" is broad and may depend strongly on the nature, type, and shape of an object, relationship to other objects, or prior constraints. The steps of this claim may be executed in parallel with other, similar steps, such that there are multiple, different "outside" portions of the object and each such different outside portion has different attributes.

Additional embodiments use more than two portions, such as an outside portion, a middle portion, and an inside portion.

Additional embodiments alter an attribute value smoothly from the outside portion to the inside portion.

For claim 19. This claim is directed to magnifying a portion of an object, as seen, without deforming the object itself. The selection of the portion and amount of magnification may depend on one or gestures or poses. An exemplary gesture is picking up a magnifier tool. Another exemplary gesture is picking up or placing a tiny element. That is, in one embodiment, the magnification is "automatic," as compared to a necessity of selecting a dedicated magnifying tool. For example, picking a watch screwdriver provides higher object magnification than picking up a sledgehammer. Placing a large element may not magnify while placing a small element does magnify. The amount of magnification may depend on the size of the element.

Embodiments include use of one or two user hands, in a continual fashion, to define the location and amount of magnification. For example, placing a hand closer to the object increases magnification. The portion of the object magnified is a portion closest to the hand. An exemplary pose for this embodiment is touching the thumb to the forefinger to create a closed loop. One may think of looking through this loop, which acts as a distance-adjustable magnifier.

Ideal, Ideally, Optimum and Preferred—Use of the words, "ideal," "ideally," "optimum," "optimum," "should" and "preferred," when used in the context of describing this invention, refer specifically a best mode for one or more embodiments for one or more applications of this invention. Such best modes are non-limiting, and may not be the best mode for all embodiments, applications, or implementation technologies, as one trained in the art will appreciate.

All examples are sample embodiments. In particular, the phrase "invention" should be interpreted under all conditions to mean, "an embodiment of this invention." Examples, scenarios, and drawings are non-limiting. The only limitations of this invention are in the claims.

May, Could, Option, Mode, Alternative and Feature—Use of the words, "may," "could," "option," "optional," "mode," "alternative," "typical," "ideal," and "feature," when used in the context of describing this invention, refer specifically to various embodiments of this invention. Described benefits refer only to those embodiments that provide that benefit. All descriptions herein are non-limiting, as one trained in the art appreciates.

All numerical ranges in the specification are non-limiting examples only.

Embodiments of this invention explicitly include all combinations and sub-combinations of all features, elements and limitation of all claims. Embodiments of this invention explicitly include all combinations and sub-combinations of all features, elements, examples, embodiments, tables, values, ranges, and drawings in the specification and drawings. Embodiments of this invention explicitly include devices and systems to implement any combination of all methods described in the claims, specification and drawings. Embodiments of the methods of invention explicitly include all combinations of dependent method claim steps, in any functional order. Embodiments of the methods of invention explicitly include, when referencing any device claim, a substation thereof to any and all other device claims, including all combinations of elements in device claims.

We claim:

1. Electronic hardware comprising:
a three-dimensional (3D) Computer Aided Design (CAD) environment;
wherein the electronic hardware is adapted to:
(a) accept a two-handed coordinated gesture by a user;
(b) transmit responsively to (a) a first action uniquely identified by a predetermined two-handed-gesture-operation map and the two-handed coordinated gesture;
(c) accept a first one-handed gesture by a first hand of the user and accept a second, different, one-handed gesture by a second hand of the user;
(d) transmit responsively to (c) one or more second actions uniquely identified by a predetermined one-handed-gesture-operation map and the first one-handed gesture and the second one-handed gesture;
wherein the two-handed coordinated gesture is performed by the user's two free hands;
wherein the first one-handed gesture and the second one-handed gesture are each performed by a first free hand and a second free hand respectively of the user;
wherein any "free hand" performing a gesture is free of fingertips touching any of:
{mouse, keyboard, trackball, tablet, or screen}.

2. The electronic hardware of claim 1:
wherein at least one of the gestures, a "selecting gesture(s)," selects a fastener;
wherein at least one following, different, gesture, a "placing gesture(s)," places a portion of the selected faster proximal to a first location on an object;
wherein the electronic hardware is adapted further to:
(e) place, responsive to the selecting and placing gestures, an associated mating element of the fastener at the first location on the object;
wherein the fastener and the associated mating element, during placing, are automatically appropriate for a material and a thickness of the object at the first location.

3. The electronic hardware of claim 2 is adapted further to:
(f) mate, responsive to (e), the selected fastener with the associated mating element in the object.

4. The electronic hardware of claim 1 is adapted further to:
- (g) generate, responsive to at least one generating gesture, a plurality of identical elements, each element comprising predetermined dimensions in at least two axes;
- (h) assemble automatically, responsive to (g), the plurality of identical elements on at least a portion of an object, such that the assembling arranges the plurality of identical elements in a uniform and contiguous pattern appropriate to the identical elements;
- wherein the generating of the identical objects is continual until the generating gesture stops.

5. The electronic hardware of claim 4 is adapted further to:
- (i) modify a first subset of the plurality of assembled identical elements such that at least one attribute value is different than an original attribute value of the elements in (g) and (h);
- wherein (i) occurs after (h).

6. The electronic hardware of claim 4 is adapted further to:
- (j) re-assign each of the assembled plurality of elements into a second subset or not into the second subset;
- wherein the re-assigning in (j) is continual while steps (g) and (h) are being repeated;
- wherein at least one attribute value of the elements in the second subset is different than the attribute value of elements not in the second subset; and
- wherein the second subset comprises elements more recently assembled in step (h) than elements not in the second subset, comprising elements less recently assembled in (h).

7. The electronic hardware of claim 4 is adapted further to:
- (k) show, responsive to (g) and (h), borders between adjacent, assembled elements in the plurality of identical elements.

8. The electronic hardware of claim 4:
- wherein the each elements in the plurality of identical elements are three-dimensional elements; and
- wherein the each elements comprise at least one predetermined analogous physical attribute.

9. The electronic hardware of claim 8:
- wherein the each elements in the plurality of identical elements are three-dimensional structural elements; and
- wherein the at least one predetermined analogous physical attribute comprises a structural strength.

10. The electronic hardware of claim 9 is adapted further to:
- (I) alter automatically a structural parameter of at least a subset of the plurality of assembled structural elements responsive to a constrain of changing properties of the object;
- wherein (I) is performed after (h); and
- wherein the changing properties of the object is after (h).

11. The electronic hardware of claim 1:
- wherein at least one of the second actions comprises at least one constraint on the motion of an object; and the first one-handed gesture is performed by the fist hand of the user; and
- wherein at least one different second action comprises at least alteration of the object; and the second one-handed gesture is performed by the second hand of the user.

12. The electronic hardware of claim 1 is adapted further to:
- (m) accept a third one-handed gesture, different than the first one-handed gesture, by the first hand of the user;
- wherein the first one-handed gesture comprises picking up a first kitchen tool;
- wherein the third one-handed gesture comprises using the first kitchen tool to alter an object; and
- wherein the object is other than food.

13. The electronic hardware of claim 1 is adapted further to:
- (n) accept a third one-handed gesture, different than the first one-handed gesture, by the first hand of the user;
- wherein the first one-handed gesture comprises picking up a pair of glasses;
- wherein the third one-handed gesture comprises putting on the pair of glasses;
- (o) transmit a temporary change to a view point of an object responsive to a first attribute of the pair of glasses;
- wherein the temporary change remains in effect until a gesture is received comprising taking of the pair of glasses.

14. The electronic hardware of claim 1 is adapted further to:
- (p) alter a transparency of a visible tool responsive to at least one speed of one or more gestures.

15. The electronic hardware of claim 1 is adapted further to:
- (q) display an object from a first viewpoint;
- (r) display at least a portion of an analogous physical object responsive to the first viewpoint;
- wherein (q) and (r) may be in any order with respect to any other step.

16. The electronic hardware of claim 1 is adapted further to:
- (s) display an object from a first viewpoint;
- (t) accept a location of the first hand of the user;
- (u) modify the transparency of the displayed object responsive to a distance between the location of the first hand and the object.

17. The electronic hardware of claim 1 is adapted further to:
- (v) display an object from a first viewpoint;
- (w) constrain the object compliant with a predetermined first set of constraints;
- wherein the constraining limits modifications to the object that are responsive to the executing in (b) and (d).

18. The electronic hardware of claim 1 is adapted further to:
- (x) display an object from a first viewpoint;
- (y) partition the object into first outside portion and a second inside portion;
- (z) alter at least one attribute value of outside portion to be different than the attribute value of the inside portion.

19. The electronic hardware of claim 1 is adapted further to:
- (aa) display an object from a first viewpoint;
- (bb) accept a gesture from the user;
- (cc) distort the display of the object such that at least one portion of the object, as seen from the first viewpoint, is enlarged relative to a remainder of the object, responsive to the gesture accepted in (bb).

20. A computer implementing a three-dimensional (3D) Computer Aided Design (CAD) environment, adapted to:
   (a) accept a two-handed coordinated gesture by a user;
   (b) execute responsively (a) a first action uniquely identified by a predetermined two-handed-gesture-operation map and the two-handed coordinated gesture;
   (c) accept a first one-handed gesture by a first hand of the user and accept a second, different, one-handed gesture by a second hand of the user;
   (d) execute responsively to (c) one or more second actions uniquely identified by a predetermined one-handed-gesture-operation map and the first one-handed gesture and the second one-handed gesture;
   wherein the two-handed coordinated gesture is performed by the user's two free hands;
   wherein the first one-handed gesture and the second one-handed gesture are each performed by a first free hand and a second free hand respectively of the user;
   wherein any "free hand" performing a gesture is free of fingertips touching any of:
   {mouse, keyboard, trackball, tablet, or screen}.

* * * * *